(12) United States Patent
Kaneko et al.

(10) Patent No.: US 9,968,890 B2
(45) Date of Patent: *May 15, 2018

(54) METHOD FOR PRODUCING FILTER MOLDED ARTICLE

(71) Applicants: SHINSHU UNIVERSITY, Nagano (JP); KOTOBUKI TSUSHOU CO., LTD., Fukuoka (JP)

(72) Inventors: Katsumi Kaneko, Nagano (JP); Toshio Takagi, Fukuoka (JP); Katsuyuki Murata, Fukuoka (JP)

(73) Assignees: SHINSHU UNIVERSITY, Nagano (JP); KOTOBUKI TSUSHOU CO., LTD., Fukuoka (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/502,811

(22) PCT Filed: Aug. 5, 2015

(86) PCT No.: PCT/JP2015/072206
§ 371 (c)(1),
(2) Date: Feb. 9, 2017

(87) PCT Pub. No.: WO2016/024506
PCT Pub. Date: Feb. 18, 2016

(65) Prior Publication Data
US 2017/0232397 A1    Aug. 17, 2017

(30) Foreign Application Priority Data
Aug. 11, 2014  (JP) ................................ 2014-163350

(51) Int. Cl.
*C01B 31/02* (2006.01)
*B01D 67/00* (2006.01)
(Continued)

(52) U.S. Cl.
CPC ......... *B01D 67/006* (2013.01); *B01D 69/125* (2013.01); *B01D 71/021* (2013.01);
(Continued)

(58) Field of Classification Search
CPC .......... G03F 7/038; G03F 7/027; G03F 7/028; G03F 7/40; C01B 31/02; C01B 32/182;
(Continued)

(56) References Cited

U.S. PATENT DOCUMENTS

| | | |
|---|---|---|
| 2010/0032368 A1 | 2/2010 | Nagai et al. |
| 2012/0004804 A1 | 1/2012 | Beams et al. |

(Continued)

FOREIGN PATENT DOCUMENTS

| | | |
|---|---|---|
| EP | 2085443 A1 | 8/2009 |
| EP | 2693446 A1 | 2/2014 |

(Continued)

OTHER PUBLICATIONS

Computer-generated translation of JP 2002-097008 (Apr. 2002).*
(Continued)

*Primary Examiner* — John A McPherson
(74) *Attorney, Agent, or Firm* — Haynes and Boone, LLP

(57) ABSTRACT

A filter molded article using a graphene with water passage holes having a desired size is produced in a simple step.
A method for producing a filter molded article having a graphene layer as a filtering material is characterized by including a step of forming a support 3 layer on a surface of a graphene 1 layer formed on initial substrates for a graphene 2 and 9, a step of forming water passage holes in the support 3 layer, a step of removing the initial substrates for a graphene 2 and 9, and a step of forming water passage holes by heating and holding the graphene 1 layer at a low temperature in the air containing oxygen of 160 to 250° C. for a predetermined time.

3 Claims, 8 Drawing Sheets

(51) Int. Cl.
*B01D 71/02* (2006.01)
*B01D 69/12* (2006.01)
*G03F 7/20* (2006.01)
*G03F 7/038* (2006.01)
*G03F 7/16* (2006.01)
*G03F 7/32* (2006.01)
*G03F 7/40* (2006.01)

(52) U.S. Cl.
CPC .............. *G03F 7/038* (2013.01); *G03F 7/162* (2013.01); *G03F 7/2004* (2013.01); *G03F 7/325* (2013.01); *G03F 7/40* (2013.01); *B01D 2323/08* (2013.01)

(58) Field of Classification Search
CPC .. B01D 67/006; B01D 67/0062; B01D 69/10; B01D 69/12; B01D 69/125; B01D 71/02; B01D 71/021; B01D 2323/08
USPC .................................................. 430/320, 330
See application file for complete search history.

(56) References Cited

U.S. PATENT DOCUMENTS

| | | | |
|---|---|---|---|
| 2012/0193285 | A1 | 8/2012 | Nagai et al. |
| 2013/0105417 | A1 | 5/2013 | Stetson et al. |
| 2013/0315816 | A1* | 11/2013 | Watson ............... C01B 31/0484 423/448 |
| 2014/0017444 | A1 | 1/2014 | Shimizu et al. |
| 2014/0212818 | A1* | 7/2014 | Kang .................. G03F 7/20 430/325 |
| 2015/0306550 | A1* | 10/2015 | Lee ...................... B01D 71/021 210/500.21 |

FOREIGN PATENT DOCUMENTS

| | | | |
|---|---|---|---|
| IL | 83310 | A | 7/1992 |
| JP | 64-055383 | A | 2/1989 |
| JP | 04-193336 | A | 11/1990 |
| JP | 2002-097008 | A * | 4/2002 |
| JP | 2006-188393 | A | 7/2006 |
| JP | 2008-062213 | A | 3/2008 |
| JP | 2008-100430 | A | 5/2008 |
| JP | 2009-073727 | A | 4/2009 |
| JP | 2012-216497 | A | 8/2012 |
| JP | 2012-175087 | A | 9/2012 |
| JP | 2013-107789 | A | 6/2013 |
| JP | 2013-144621 | A | 7/2013 |
| JP | 2013-536077 | W | 9/2013 |
| JP | 2011-526834 | W | 10/2015 |
| WO | WO 2003/099717 | A | 12/2003 |
| WO | WO 2008/050577 | A1 | 5/2008 |
| WO | WO 2012/027148 | A1 | 1/2012 |
| WO | WO 2012/133029 | A1 | 10/2012 |
| WO | WO 2014/099649 | A1 | 6/2014 |

OTHER PUBLICATIONS

"Graphene Makes for Finer Filters", Professional Engineering, Mar. 2014.*

English Translation of the International Search Report issued by the Japan Patent Office regarding International Application No. PCT/JP2015/072206,dated Sep. 8, 2015, 3 pages.

Written Opinion issued by the Japan Patent Office regarding International Application No. PCT/JP2015/072206,dated Sep. 8, 2015, 5 pages.

International Preliminary Examination Report issued by the Japan Patent Office regarding International Application No. PCT/JP2015/072206,dated Sep. 9, 2016, 10 pages.

* cited by examiner (a)

(b)

(a)

(b)

METHOD FOR PRODUCING FILTER MOLDED ARTICLE

CROSS REFERENCE

This application is a United States national phase application of co-pending international patent application number PCT/JP2015/072206, filed Aug. 5, 2015, which claims priority to Japanese patent application number 2014-163350, filed Aug. 11, 2014, the entire disclosures of which are hereby incorporated herein by reference.

TECHNICAL FIELD

The present invention relates to a method for producing a filter molded article, particularly to a method for producing a filter molded article having a filter using a graphene.

BACKGROUND ART

In recent years, as a filter for removing fine particles such as ions from water, another solution, or gas, a filter molded article employing a graphene having fine water passage holes formed has come to be used (Patent Literature 1).

In general, a graphene is formed on a surface of a copper foil or the like by a chemical vapor deposition (CVD) method (Patent Literature 2). Therefore, conventionally, a step of transferring the graphene to a desired support, called transfer, has been necessary when the graphene is used as a filter molded article (Patent Literature 3).

In the transfer step, an exposed surface of the graphene formed on a copper foil is spin-coated with PMMA to form and dry a thin protective film. Thereafter, the resulting product is floated in a Cu etching solution heated to 50° C. with the copper foil facing downward to remove the copper foil.

Subsequently, the thin film formed of PMMA and the graphene is washed with ultrapure water, and is scooped up so as to be placed on a silicon substrate having a hydrophilized surface.

Thereafter, the above thin film is scooped up with a desired support formed of a resin or the like, and is dried. Immersion in acetone and immersion in IPA are repeated alternately several times to remove the protective film of PMMA.

Finally, by drying the support and the graphene, the graphene can be transferred to the support.

In such a conventional transfer step, a chemical or the like is consumed, time is consumed, and productivity is low.

In a step of forming a coating on a surface of a graphene layer, removing the coating therefrom, scooping up the graphene layer with a silicon substrate or the like, or removing the graphene layer therefrom, the extremely thin graphene may be broken.

Conventionally, in order to form water passage holes in a graphene, the graphene has been heated in the air or in a mixed gas of oxygen and an inert gas (nitrogen, argon, helium, or the like) at a high temperature of about 300 to 500° C. (Patent Literature 1).

However, in this method, a film resist supporting the graphene is broken due to heat. In addition, control of a reaction is difficult and sizes of the water passage holes opened in the graphene are not uniform due to hole-opening by a combustion reaction of a graphite. Therefore, this method is not suitable for a filter molded article requiring uniform water passage holes.

Furthermore, cinders of the support formed of a resin or the like generated during combustion may contaminate the graphene to lower performance of a filter molded article.

In addition to the graphene, anion selection filter using carbon nanotubes (Patent Literature 4) or carbon nanohorns (Patent Literature 5) has been used (hereinafter, a single walled carbon nanohorn is abbreviated as SWNH).

As another method for forming a water passage hole in carbon nanomaterials, there is a method for attaching nitrates to carbon nanomaterials as an oxygen supply means and heating the carbon nanomaterials in vacuum or an inert gas at 300° C. to form holes (Patent Literature 6).

CITATION LIST

Patent Literature

Patent Literature 1: JP 2013-536077 W
Patent Literature 2: JP 2013-144621 A
Patent Literature 3: JP 2013-107789 A
Patent Literature 4: JP 2011-526834 W
Patent Literature 5: WO 2003/099717 A (domestic re-publication)
Patent Literature 6: JP 2009-073727 A

SUMMARY OF INVENTION

Technical Problem

The present invention has been achieved in order to solve the above problems, and an object thereof is to produce a filter molded article using a graphene with water passage holes having a desired size in a simple step.

Solution to Problem

In the present invention, a means for solving the above problems is as follows.

A first invention is a method for producing a filter molded article having a graphene layer as a filtering material, characterized by including a step of forming a support layer on a surface of a graphene layer formed on an initial substrate for a graphene, a step of forming water passage holes on the support layer, a step of removing the initial substrate for the graphene, and a step of forming water passage holes by heating and holding the graphene layer at a low temperature in the air containing oxygen of 160 to 250° C. for a predetermined time.

A second invention is characterized in that the support is a negative photoresist and that the step of forming water passage holes in the support layer includes a step of exposing portions other than portions in which water passage holes of the photoresist should be formed to light.

A third invention is characterized in that the step of forming water passage holes by heating and holding the graphene layer at a low temperature is performed in the air containing oxygen of 200 to 250° C.

Advantageous Effects of Invention

According to the first invention, by forming water passage holes by heating and holding the graphene layer at a low temperature in the air containing oxygen of 160 to 250° C. for a predetermined time, a reaction is mild and can be controlled easily, and by controlling a length of heating time, holes having a desired size can be formed uniformly in the graphene. In addition, by heating the graphene at the low temperature, breakage of the support can be prevented. Therefore, contamination of the graphene can be also prevented.

According to the second invention, the support is a negative photoresist, and the step of forming water passage holes in the support layer includes a step of exposing portions other than portions in which water passage holes of the photoresist should be formed to light. Therefore, the filter molded article can be formed without going through a transfer step to cause breakage of a graphene.

In addition, by using a photo lithography technique in which only portions in which water passage holes should be formed are not exposed to light, the size and the shape of water passage holes formed in the resist can be controlled in detail. This allows water passage holes to be formed in a film resist to such an extent to have less influence on ability of the graphene as a filter while increasing strength as a support.

According to the third invention, the step of forming water passage holes by heating and holding the graphene layer at a low temperature is performed in the air containing oxygen of 200 to 250° C. Therefore, the water passage holes can be formed surely in the graphene in a relatively short time.

BRIEF DESCRIPTION OF DRAWINGS

FIG. 1(a) is a plan view. FIG. 1(b) is a cross-sectional view. In FIGS. 1(a) and 1(b), (1) illustrates the time of start, (2) illustrates the time of attaching a graphene to a film resist, (3) illustrates the time of exposing the film resist to light, (4) illustrates the time of developing the film resist, (5) illustrates the time of removing a silicon substrate and a copper foil, and (6) illustrates the time of opening a hole in the graphene.

FIG. 2(a) is a plan view. FIG. 2(b) is a cross-sectional view. In FIGS. 2(a) and 2(b), (1) illustrates the time of start, (2) illustrates the time of spin-coating a liquid resist, (3) illustrates the time of exposing a resist layer to light, (4) illustrates the time of developing the resist layer, (5) illustrates the time of removing a silicon substrate and a copper foil, and (6) illustrates the time of opening a hole in the graphene.

FIG. 3(a) uses SWNH which has been treated at 250° C. FIG. 3(b) uses SWNH which has been treated at 200° C.

FIG. 5(a) uses SWNH which has been treated at 250° C. FIG. 5(b) uses SWNH which has been treated at 200° C.

DESCRIPTION OF EMBODIMENTS

Hereinafter, a method for producing a filter molded article according to a first embodiment of the present invention will be described.

In this filter molded article, a graphene is used as a filter.

Figure 1:
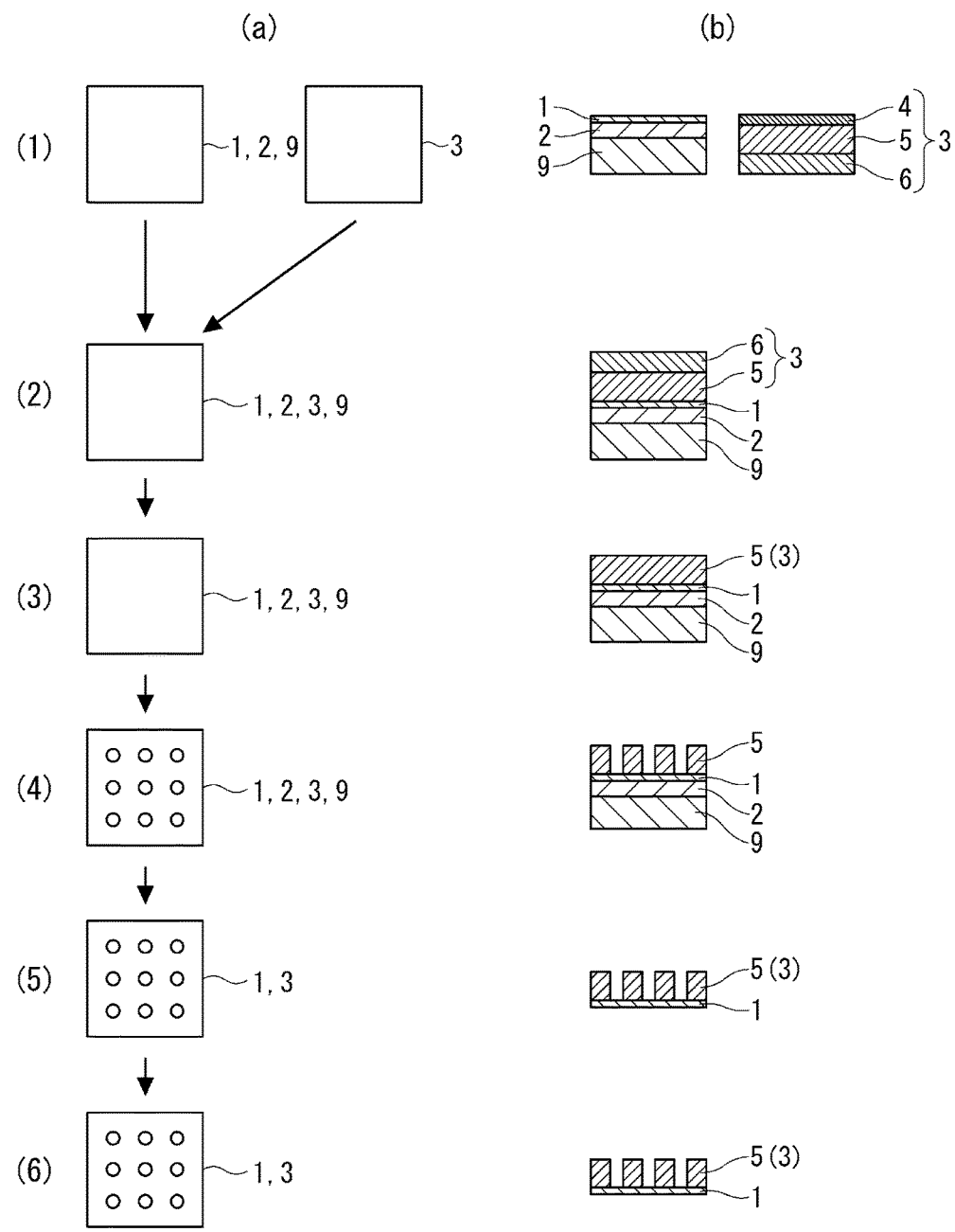
FIGS. 1(a) and 1(b) are diagrams illustrating a method (step) for producing a filter molded article according to a first embodiment of the present invention.

As illustrated in FIG. 1(1), as a graphene 1, the graphene 1 obtained by forming a copper foil 2 on a silicon substrate 9 and growing a graphene on the copper foil 2 is used. For example, a 1 µm film of the copper foil 2 is formed on a 4 inch silicon wafer (silicon substrate 9) having a thickness of 300 µm by sputtering film formation, and the resulting product is cut into 1 $cm^2$ to form a substrate.

The graphene 1 can be formed on the copper foil 2 by a CVD method at 500 sccm of 50% hydrogen with argon balance at 1 sccm of methane at 1000° C. for 10 minutes.

A monolayer graphene is preferably used as the graphene 1, but a multilayer graphene may be used. Only the graphene 1 and the copper foil 2 obtained by removing a Si substrate with a reagent in advance may be used. A graphene may be held on an initial substrate for a graphene, formed of a material other than the copper foil 2.

The graphene 1 is desirably a monolayer graphene formed of a single crystal having a large crystal size.

As illustrated in FIG. 1(1), a film resist 3 formed of a photoresist is used as a support holding the graphene 1 in the filter molded article.

Properties required for the photoresist used here are as follows. That is, the photoresist needs to be robust enough to be used as a support, needs to be a negative photoresist to reduce solubility in a developing solution due to exposure to light, and needs to be a resin having high heat resistance, such as a polyimide or an epoxy resin.

In this embodiment, a film resist "Raytec" manufactured by Hitachi Chemical Co., Ltd., used for an insulating film of a printed substrate or the like as an epoxy resin solder resist, is used.

Raytec is a film resist having a three-layer structure of a protective layer 4, a resist layer 5, and a support layer 6. The resist layer 5 is a layer formed of an epoxy resin solder resist. The support layer 6 is formed on one surface of the resist layer 5 to protect the resist layer 5. The protective layer 4 is attached to the other surface of the resist layer 5 to protect the resist layer 5 until the resist layer 5 is attached to the graphene 1. The protective layer 4 and the support layer 6 can be peeled off from the resist layer 5 by holding the protective layer 4 and the support layer 6 by hand.

The thicker film resist 3 is used more easily as a filter. Therefore, it is preferable to use a film resist as thick as possible. In this embodiment, a Raytec having a film thickness of 30 µm (model: FZ-2730GA) is used.

As illustrated in FIG. 1(2), in order to form a filter molded article from the graphene 1 and the film resist 3, first, the film resist 3 is attached to the graphene 1.

In order to pressure-bond the film resist 3 to the graphene 1 firmly by removing the air between the film resist 3 and the graphene 1, a vacuum laminator is used for attachment. For example, a laminator for a semiconductor process such as MVLP-600 manufactured by Meiki Co., Ltd. is the most suitable. However, a home laminator or a simple laminator may be used.

The protective layer 4 of the film resist 3 is peeled off by hand, the film resist 3 is placed on the graphene 1 layer formed on the copper foil 2 such that the resist layer 5 is brought into close contact with the graphene 1 layer, and the resulting product is put in a laminator film to be subjected to vacuum pressure bonding at −50 kPa for 20 seconds using a vacuum laminator.

This step is performed in a yellow room in order to prevent exposure of the film resist 3 to light.

Subsequently, the graphene 1 and the film resist 3 are taken out of the laminator film, are heated on a hot plate heated at 80° C. for 60 seconds and pressurized at 0.4 MPa, and are then cooled naturally to room temperature. In this step, the resist layer 5 is bonded to the graphene 1.

Thereafter, the resulting product is allowed to stand at 25° C. for 15 minutes. Here, by settling the film resist 3 (resist layer 5), exposure to light described below can be performed uniformly.

Subsequently, the support layer 6 of the film resist 3 is peeled off by hand to expose the resist layer 5.

These steps are also performed in a yellow room in order to prevent exposure of the film resist 3 to light.

Subsequently, as illustrated in FIG. 1(3), the film resist 3 is exposed to light. The resist layer 5 of the film resist 3 is thereby stabilized so as not to be dissolved in a solvent.

In the step of exposure to light, irradiation is performed at 180 mJ/cm$^2$ with an i-line stepper using a high-pressure mercury lamp. For example, EXP-2031 manufactured by Orc Manufacturing Co., Ltd. can be used.

At this time, by masking a part of a surface of the film resist 3 with chromium, the part covered with the mask is not exposed to light, and is removed by development described below. Therefore, water passage holes can be formed in the film resist 3.

For example, circular pieces of chromium each having a diameter of 500 μm are arranged in vertical and horizontal directions such that a distance between the centers thereof is a 1000 μm pitch to form a gap of at least 500 μm between the pieces of chromium (refer to FIG. 1(a) (4)).

After exposure to light, the film resist 3 is allowed to stand at 25° C. for about 30 minutes.

These steps are also performed in a yellow room in order to prevent unnecessary exposure of the film resist 3 to light.

Subsequently, as illustrated in FIG. 1(4), the film resist 3 is developed.

The film resist 3 is developed for 80 seconds while a 1% sodium carbonate aqueous solution at 30° C. is used as a developing solution and a spray pressure is 0.16 MPa. After development, washing with ultrapure water at a spray pressure of 0.12 MPa for 80 seconds is repeated three times.

In the step of development, for example, a fully automatic single-wafer type developing device manufactured by Tokyo Ohka Kogyo Co., Ltd. can be used.

The masked part in the resist layer 5 of the film resist 3 is thereby washed away during development, and water passage holes are formed.

These steps are also performed in a yellow room in order to prevent exposure of the film resist 3 to light.

Thereafter, as illustrated in FIG. 1(5), the silicon substrate 9 is removed by etching.

In etching, the silicon substrate 9 is floated in a 25% TMAH solution heated to 90° C. with the surface thereof facing downward, and the solution is continuously stirred slowly for 12 hours with a stirring device (stirrer).

An etching rate is assumed to be 0.45 μm/min, and etching time is set such that over-etching slightly occurs in accordance with the thickness of the silicon substrate 9.

After termination, it is visually confirmed whether the silicon substrate 9 remains. When etching is insufficient, a step of performing etching and confirming the silicon substrate 9 visually is repeated.

When it is confirmed that the silicon substrate 9 has been completely removed, the graphene 1 or the like is floated in ultrapure water with the surface of the copper foil 2 facing downward, and is washed.

Subsequently, as illustrated in FIG. 1 (5), the copper foil 2 on the graphene 1 is removed.

When the copper foil 2 is peeled off mechanically, the graphene 1 is broken. Therefore, the copper foil 2 is dissolved by etching to be removed.

The graphene 1 and the film resist 3 are floated in a mixed aqueous solution of 0.5 mol/l hydrochloric acid and 0.5 mol/l iron (III) chloride as a Cu etching solution at 50° C. with the surface of the copper foil 2 facing downward. The graphene 1 and the film resist 3 are allowed to stand for one hour. It is visually confirmed whether the copper foil 2 remains. When etching is insufficient, a step of performing etching further 10 minutes and confirming the copper foil 2 visually is repeated.

When it is confirmed that the copper foil 2 has been removed completely, the graphene 1 and the film resist 3 are floated in ultrapure water with the surface of the graphene 1 facing downward.

Thereafter, ultrapure water is exchanged, and the same washing is performed twice to remove the etching solution.

Subsequently, the graphene 1 and the film resist 3 are rinsed with IPA, and are heated in a clean oven which has been heated to 160° C. in advance for one hour. The heating step causes polymerization of the resist layer 5 to proceed, and cures and chemically stabilizes the film resist 3.

Subsequently, as illustrated in FIG. 1(6), water passage holes for passing of water is formed in the graphene 1. These water passage holes need to have such a size that water can pass therethrough but impurities or an ion cannot pass therethrough.

Holes of the graphene 1 are opened after the copper foil 2 is removed because the remaining copper foil 2 acts as a catalyst to burn the graphene 1 during heating.

Holes are opened by heating the graphene 1 in the air at 160 to 250° C. for a predetermined time.

Here, the air is not limited to a mixed gas containing about 20% of $O_2$ and about 80% of $N_2$. As long as the air contains 1% or more of $O_2$, the other gases contained are not limited. A mixed gas containing an inert gas and another gas is widely allowable.

Conventionally, it has been considered that a graphene is not perforated at a low temperature of less than 300° C.

However, the film resist 3 is not broken and holes are opened gradually and slowly in the graphene 1 to be enlarged at a low temperature of 160 to 250° C. Therefore, the size of water passage holes can be controlled by a length of heating time. When the water passage holes are opened in the air at 200 to 250° C., cinders do not generated. Therefore, the water passage holes can be opened while a clean surface is maintained.

Even when heating is performed for a long time at a temperature of lower than 160° C., holes can be hardly formed in a graphene. At a temperature of 250° C. or higher, a reaction occurs rapidly, it is difficult to control holes so as to have a desired size, and the size of the holes are not uniform.

The temperature for low temperature heating is particularly desirably set to 200 to 250° C.

For example, when water passage holes are formed by leaving a graphene in the air at 200° C. for 20 hours, a filter molded article produced in this way can remove salt from seawater to change the seawater into fresh water.

The predetermined time means time to bring about an effect for forming holes in a graphene while an atmosphere of 160 to 250° C. is maintained.

In the above example, the film resist 3 is used as a support. However, the support only needs to be a material having no influence on a low temperature heating treatment of the graphene 1 and capable of supporting the graphene 1 as a filter. For example, a resin or another material having adhesion to the graphene 1 may be used as a support, or a resin or another support may be used together with a heat-resistant adhesive.

Figure 7:
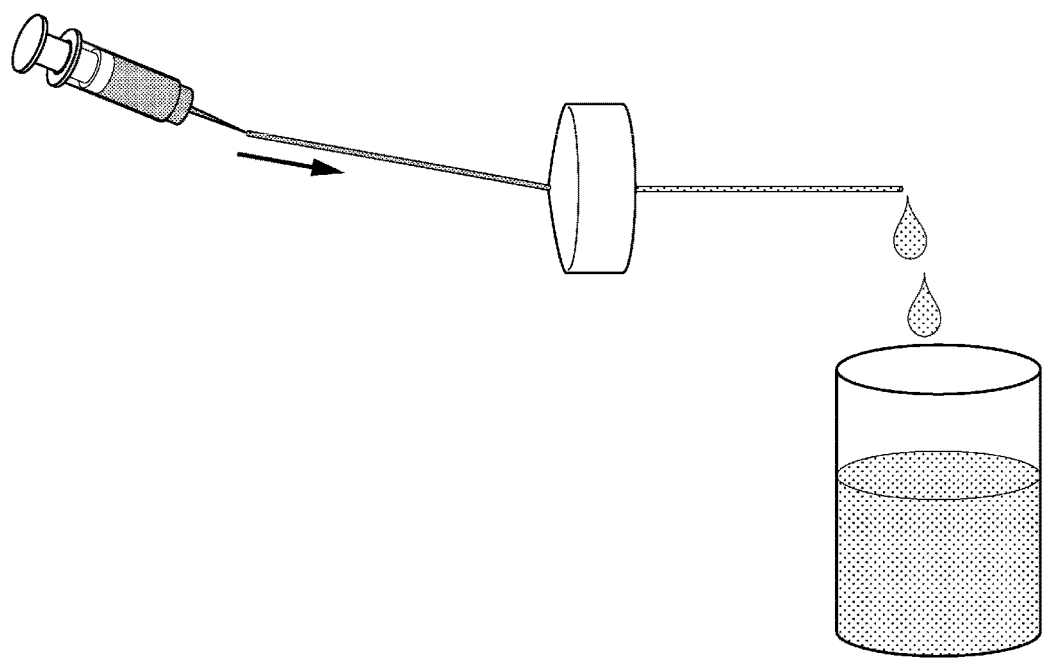
FIG. 7 is an explanatory diagram illustrating a method for using a filter molded article according to an embodiment of the present invention.

As illustrated in FIG. 7, the filter molded article produced in this way can be used as a filter of a water purification apparatus using a membrane filter.

For example, the filter molded article is cut into a circle of ½ inches using a craft punch (manufactured by Carl Jimuki Co., Ltd.). This filter molded article is disposed downstream of a membrane filter of ½ inches while the resist layer 5 thereof faces upstream and the graphene 1 layer faces downstream to be set in a membrane filter holder 7.

As the membrane filter, for example, a polycarbonate membrane filter "Isopore GTTP (pore diameter 0.2 μm)" manufactured by Merck KGaA can be used.

As the membrane filter holder 7, for example, a "Swinnex" manufactured by Merck KGaA can be used.

In order to filter a solution using such a water purification apparatus, a solution to be filtered (for example, seawater) is put into a syringe 8, the syringe 8 is connected to the membrane filter holder 7, the syringe 8 is pressed to filter the solution, and water from which impurities or ions has been removed can be thereby obtained.

In the first embodiment, by forming water passage holes by heating and holding the graphene 1 at a low temperature in the air containing oxygen of 160 to 250° C. for a predetermined time, a reaction is mild and can be controlled easily, and by controlling a length of heating time, holes having a desired size can be formed uniformly in the graphene. In addition, by heating the graphene at a low temperature, breakage of the support can be prevented. Therefore, contamination of the graphene can be also prevented.

By attaching the film resist 3 formed of a negative photoresist as a support to the graphene 1, the filter molded article can be formed without going through a transfer step to cause breakage of the graphene 1.

Furthermore, by using a photolithography technique in which portions in which water passage holes should be formed are masked in the film resist 3 and the other portions are exposed to light, the size and the shape of water passage holes formed in the film resist 3 can be controlled in detail. This allows water passage holes to be formed in the film resist 3 to such an extent to have less influence on ability of the graphene 1 as a filter while increasing strength as a support.

Second Embodiment

The second embodiment is characterized by forming a resist layer 5 by spin-coating a negative liquid resist on a surface of a graphene in place of using the film resist 3 formed of a negative photoresist in the first embodiment.

Figure 2:
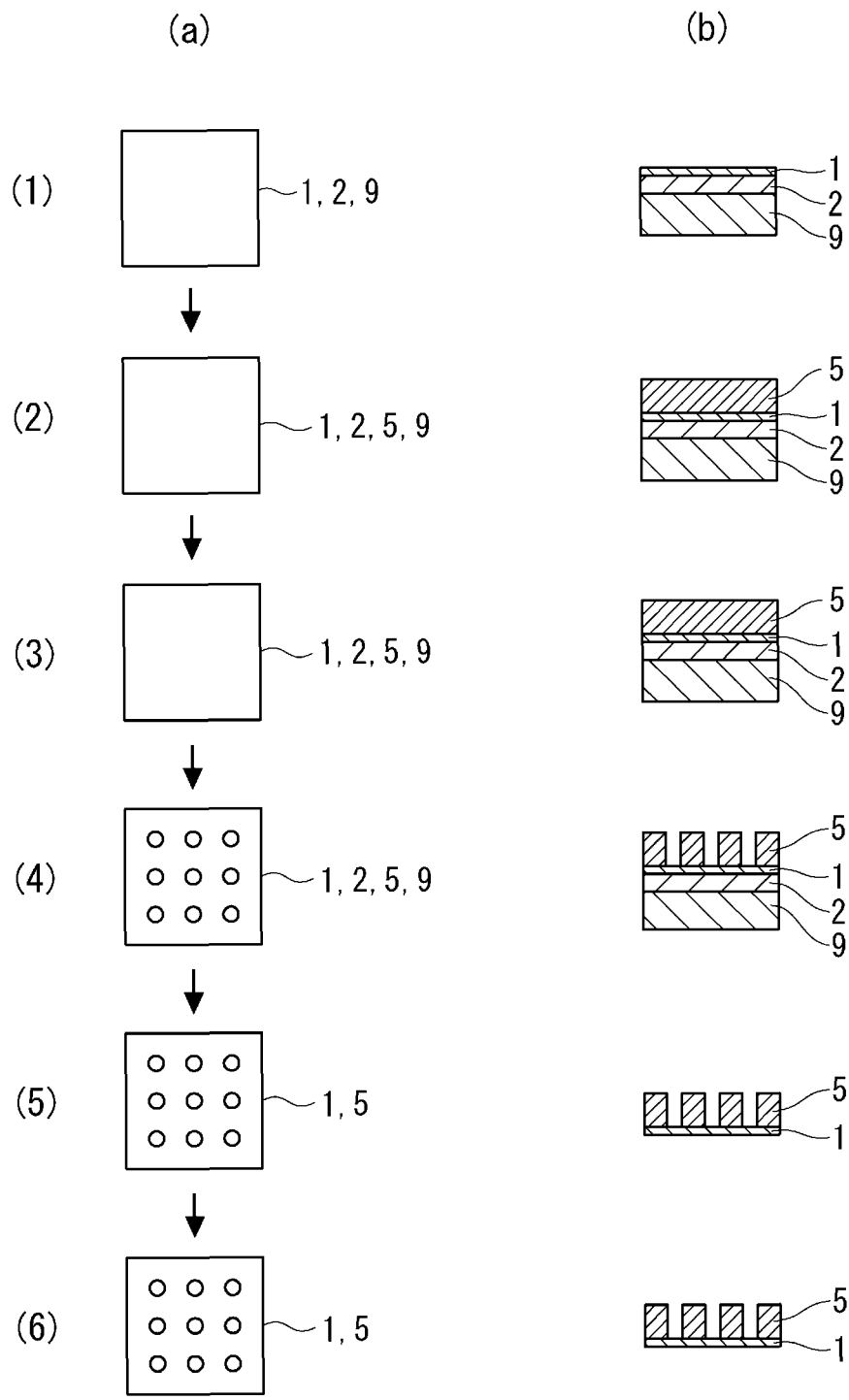
FIGS. 2(a) and 2(b) are diagrams illustrating a method (step) for producing a filter molded article according to a second embodiment of the present invention.

Also in the second embodiment, as illustrated in FIG. 2(1), a graphene obtained by forming a copper foil 2 on a silicon substrate 9 and growing a graphene 1 on the copper foil 2 is used.

In the second embodiment, first, the resist layer 5 is formed on a surface of the graphene 1, as illustrated in FIG. 2(2).

The resist preferably has similar performance to that in the first embodiment in addition to be a liquid resist.

As such a liquid resist, an epoxy resin SU-8 3050 manufactured by Microchem Corporation is used.

The liquid resist is spin-coated on the graphene at 3000 rpm for 20 seconds using a spin coater to form a resist layer having a thickness of 50 μm.

After spin-coating, the resist layer 5 is subjected to soft baking at 95° C. for 20 minutes using a hot plate to cure the resist layer 5.

These steps are performed in a yellow room in order to prevent exposure of a film resist 3 to light.

Subsequently, as illustrated in FIG. 2(3), the resist layer 5 is exposed to light to be stabilized.

In exposure to light, irradiation is performed at 200 mJ/cm$^2$ with an i-line stepper using a high-pressure mercury lamp (EXP-2031 manufactured by Orc Manufacturing Co., Ltd.).

As in the first embodiment, by masking apart of a surface of the resist layer 5 with chromium, water passage holes are formed (refer to FIG. 2(a) (4)).

After exposure to light, soft baking is performed at 65° C. for five minutes. At this time, a resin is polymerized, and a portion which has been exposed to light is not dissolved even after being developed.

These steps are also performed in a yellow room in order to prevent unnecessary exposure of the film resist 3 to light.

Subsequently, as illustrated in FIG. 2(4), the resist layer 5 is developed.

A SU-8 Developer manufactured by Microchem Corporation is used for development.

The SU-8 Developer is placed in a bat including the resist layer 5, and is shaken about for eight minutes. The SU-8 Developer is an organic solvent, and therefore the operation is performed in a draft.

After development, the resist layer 5 is immersed in a new SU-8 Developer, is shaken about for 10 seconds, is then immersed in IPA, and is shaken for 10 seconds. Thereafter, the resist layer 5 and the graphene 1 are taken out and dried.

The masked portion in the resist layer 5 is thereby washed away during development, and water passage holes are formed.

These steps are also performed in a yellow room in order to prevent exposure of the film resist 3 to light.

As illustrated in FIGS. 2(5) and 2(6), steps from a step of removing the silicon substrate 9 and the copper foil 2 up to a step of forming water passage holes in the graphene 1 are performed in a similar manner to the first embodiment.

Also in the second embodiment, by forming the resist layer 5 by spin-coating a liquid resist formed of a negative photoresist as a support on the graphene 1, the filter molded article can be formed without going through a transfer step to cause breakage of the graphene 1.

Furthermore, by using a photolithography technique in which portions in which water passage holes should be formed are masked in the resist layer 5 and the other portions are exposed to light, the size and the shape of water passage holes formed in the film resist can be controlled in detail.

<Test>

A test was performed in order to measure an effect of the present invention.

For a measurement test, single-walled carbon nanohorns (SWNH) was used. SWNH basically has the same structure as a graphene, but is formed into a conical shape.

In this test, the nitrogen adsorption amount at 77K was measured using an adsorption measurement apparatus "Autosorb-iQ" manufactured by Quantachrome Instruments Japan G. K. Nitrogen gas is supplied to an outside of the SWNH, and the amount of nitrogen gas was measured after a predetermined time had passed. When holes through which nitrogen can pass are present on a peripheral surface of the SWNH, nitrogen enters the SWNH and is adsorbed by an inner wall thereof. Therefore, a difference between the amount of nitrogen supplied and the amount of nitrogen outside the SWNH after the test indicates the nitrogen adsorption amount. The diameter of holes and the size thereof can be determined.

Figure 3:
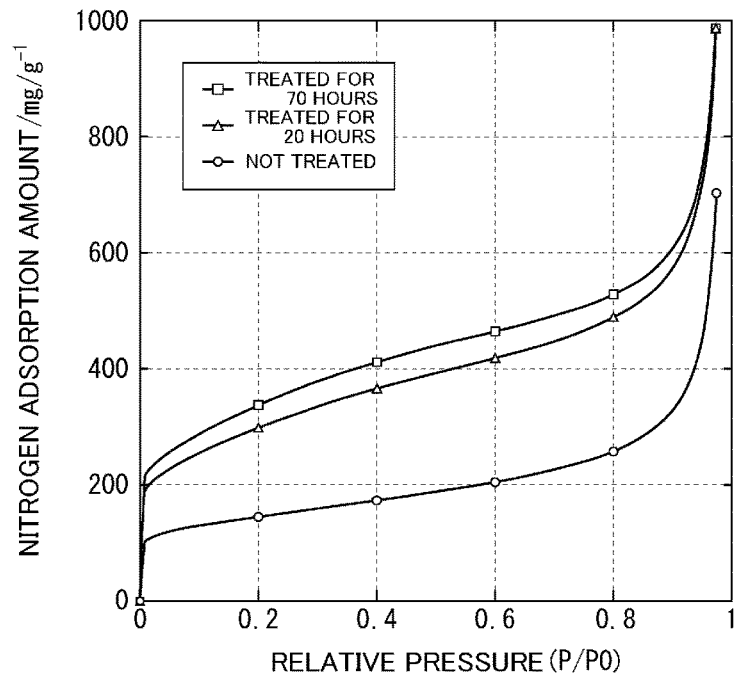
FIGS. 3(a) and 3(b) are graphs indicating test results obtained by measuring the nitrogen adsorption amount of SWNH in a graphene structure.
Figure 3:
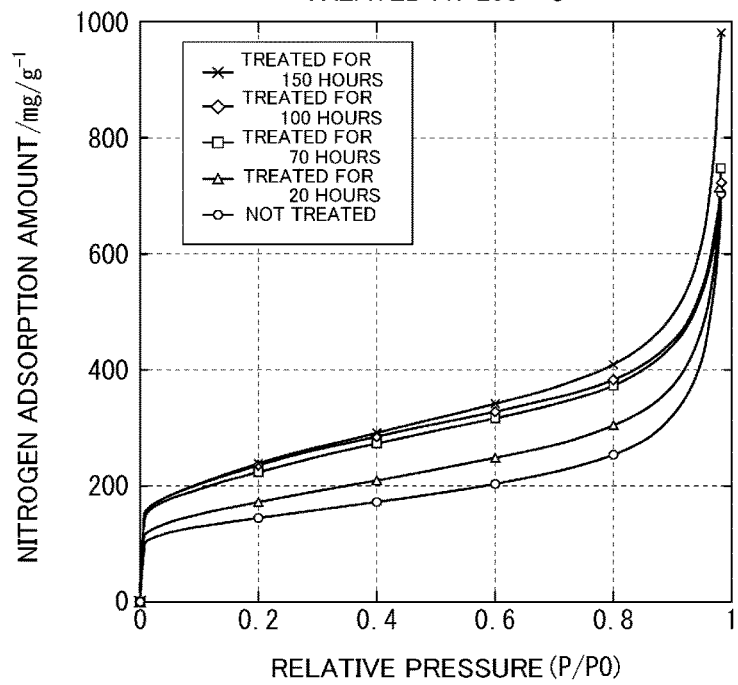

In FIG. 3($a$), SWNH which had not been treated, SWNH which had been treated in the air at 250° C. for 20 hours, and SWNH which had been treated in the air at 250° C. for 70 hours were prepared, and the nitrogen adsorption amount was measured for each of the SWNHs by supplying nitrogen at different relative pressures.

In the SWNH which had been treated for 20 hours, the nitrogen adsorption amount was largely increased from a low pressure toward a high pressure compared with the SWNH which had not been treated. It is found that holes through which nitrogen passes has been formed.

In the SWNH which had been treated for 70 hours, the adsorption amount was increased compared with the SWNH which had been treated for 20 hours. This means that the number of the SWNH having holes opened was increased in the SWNH which had been treated for 70 hours. That is, the number of holes formed was increased, and consequently a ratio of holes opened in the SWNH was increased. The adsorption amount was thereby increased. Therefore, it is found that the number of holes has been increased.

In FIG. 3($b$), SWNH which had not been treated, SWNH which had been treated in the air at 200° C. for 20 hours, SWNH which had been treated in the air at 200° C. for 70 hours, SWNH which had been treated in the air at 200° C. for 100 hours, and SWNH which had been treated in the air at 200° C. for 150 hours were prepared, and the nitrogen adsorption amount was measured for each of the SWNHs by supplying nitrogen at different relative pressures.

When the SWNH were treated at 200° C., the nitrogen adsorption amount was increased as the treatment time was longer although the increase amount was not as large as the SWNH which had been treated at 250° C. That is, it is found that the number of holes has been increased as the treatment time is longer.

Figure 4:
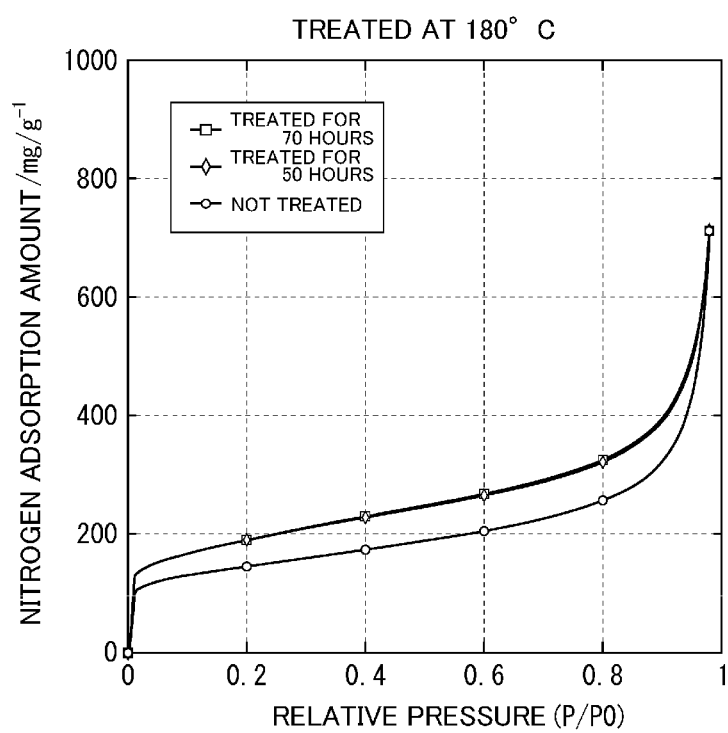
FIG. 4 is a graph indicating test results obtained by measuring the nitrogen adsorption amount of SWNH which has been treated at 180° C.

In FIG. 4, SWNH which had not been treated, SWNH which had been treated in the air at 180° C. for 50 hours, and SWNH which had been treated in the air at 180° C. for 70 hours were prepared, and the nitrogen adsorption amount was measured for each of the SWNHs by supplying nitrogen at different relative pressures.

In the SWNH which had been treated for 50 hours, the nitrogen adsorption amount was increased from a low pressure toward a high pressure compared with the SWNH which had not been treated. It is found that holes through which nitrogen passes has been formed.

On the other hand, in the SWNH which had been treated for 70 hours, the nitrogen adsorption amount was hardly increased compared with the SWNH which had been treated for 50 hours. Therefore, it is found that the number of holes is hardly increased at 180° C. even when the treatment time is longer.

Next, ion selectivity of a graphene having holes formed therein was measured.

A hydrated ion radius of a cation satisfies $Li^+ > Na^+ > K^+ > Rb^+ > Cs^+$. Therefore, ion selectivity of a filter using a graphene was measured according to ion transmissivity of each ion.

Figure 5:
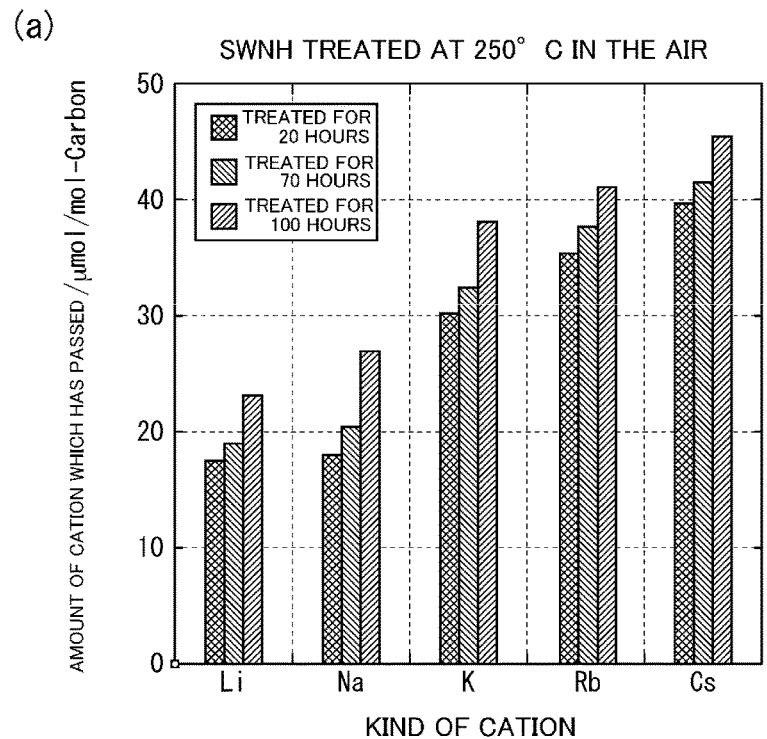
FIGS. 5(a) and 5(b) are graphs indicating test results obtained by measuring the amounts of ions passing through holes formed in SWNH.
Figure 5:
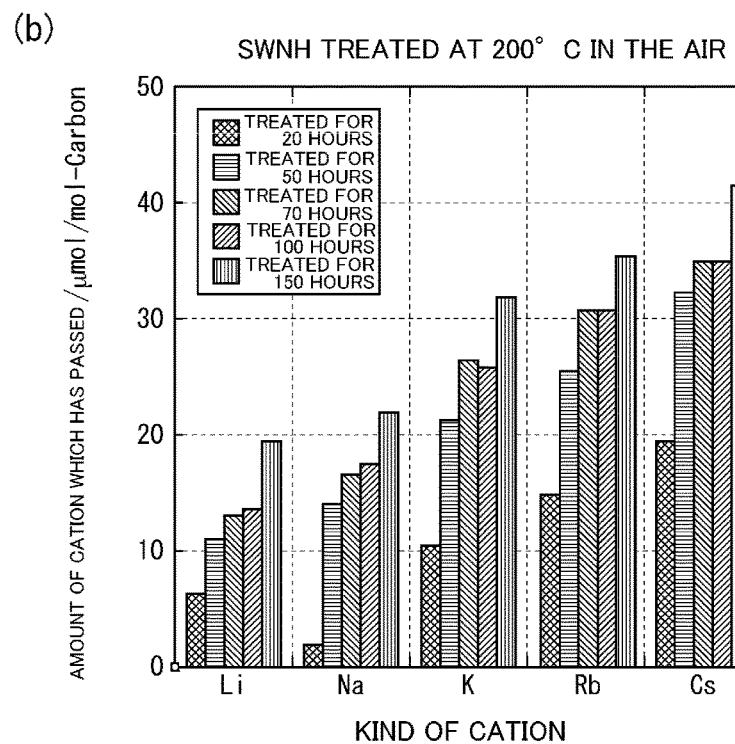

In a test, 24 mg of SWNH was added to 6 mL of a mixed solution of Li, Na, K, Rb, and Cs at 20 µmol/L, and the resulting mixture was allowed to stand at 30° C. for 24 hours. Thereafter, an ion concentration of the solution was measured by ion chromatography. When cations pass through holes opened in the SWNH and adhere to an inside of the SWNH, the ion concentration measured becomes smaller. In FIGS. 5($a$) and 5($b$), the amount of ions which had passed through holes was measured using a change in the concentration.

In FIG. 5($a$), SWNH which had been treated in the air at 250° C. for 20 hours, SWNH which had been treated in the air at 250° C. for 70 hours, and SWNH which had been treated in the air at 250° C. for 100 hours were prepared, and each of the SWNHs was put into the mixed solution.

As a result, it is found that all the cations have passed regardless of the length of the treatment time. Therefore, it is found that the SWNH which has been treated at 250° C. for 20 hours or more has larger holes formed therein and has no ion selectivity.

In FIG. 5($b$), SWNH which had been treated in the air at 200° C. for 20 hours, SWNH which had been treated in the air at 200° C. for 50 hours, SWNH which had been treated in the air at 200° C. for 70 hours, SWNH which had been treated in the air at 200° C. for 100 hours, and SWNH which had been treated in the air at 200° C. for 150 hours were prepared, and each of the SWNHs was put into the mixed solution.

As a result, it is found that the SWNH which has been treated for 20 hours has hardly transmitted ions having large hydrated ion radius such as Li or Na, but has transmitted ions having small hydrated ion radius such as K, Rb, or Cs.

On the other hand, it is found that the SWNH which has been treated for 50 hours or more has transmitted all the ions due to larger holes.

Figure 6:
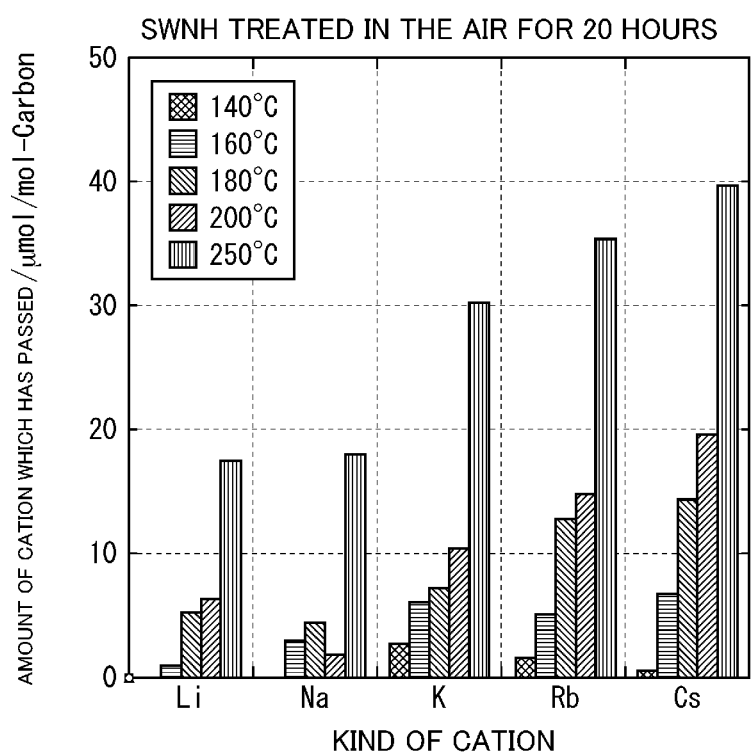
FIG. 6 is a graph indicating test results obtained by measuring the amounts of ions passing through holes formed in SWNH while comparison is performed for each temperature at which SWNH has been heated.

FIG. 6 illustrates comparison of ion selectivity at each heating temperature while the treatment time is fixed to 20 hours.

SWNH which had been treated in the air at 140° C. for 20 hours, SWNH which had been treated in the air at 160° C. for 20 hours, SWNH which had been treated in the air at 180° C. for 20 hours, SWNH which had been treated in the air at 200° C. for 20 hours, and SWNH which had been treated in the air at 250° C. for 20 hours were prepared, and each of the SWNHs was put into the mixed solution.

It is found that the SWNH which has been treated at 140° C. has hardly transmitted ions because holes has been hardly opened.

It is found that the SWNH which has been treated at 160° C. and the SWNH which has been treated at 180° C. have transmitted only a small amount of ions due to small holes. In addition, it is found that the SWNH which has been treated at 160° C. and the SWNH which has been treated at 180° C. have small transmission amounts of K, Rb, and Cs and have no ion selectivity.

It is found that the SWNH which has been treated at 200° C. has ion selectivity due to small transmission amounts of Li and Na and large transmission amounts of K, Rb, and Cs.

It is found that the SWNH which has been treated at 250° C. has large transmission amounts of all the ions.

Figure 8:
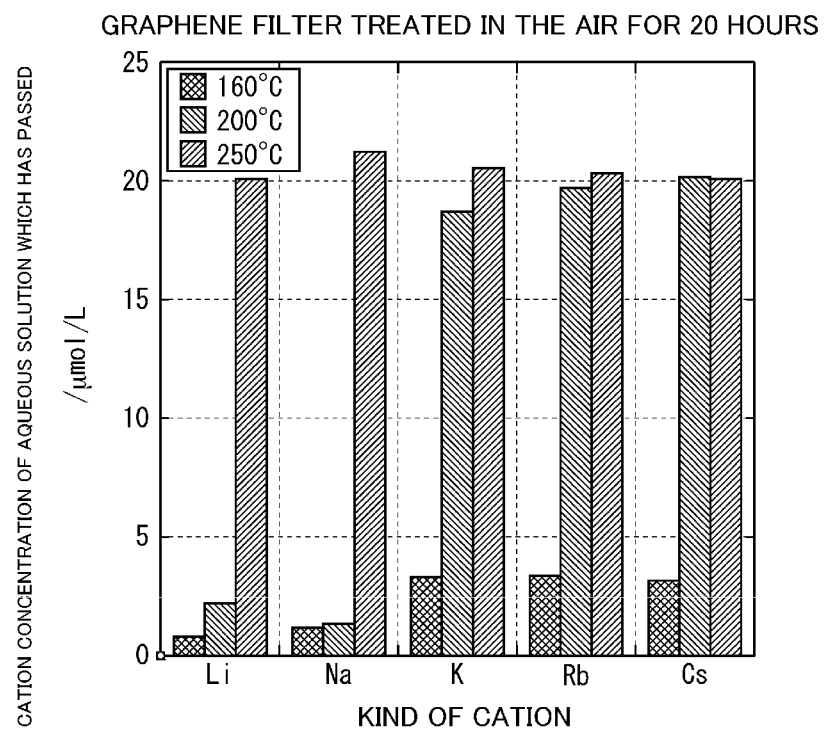
FIG. 8 is a graph indicating test results obtained by measuring the amounts of ions passing through holes formed in a graphene while comparison is performed for each temperature at which the graphene has been heated.

In FIGS. 7 and 8, as described above, the graphene 1 was set in the membrane filter holder 7, a mixed solution of Li, Na, K, Rb, and Cs at 20 µmol/L was allowed to pass through the graphene 1 from the syringe 8, and an ion concentration of the transmission solution was measured.

A graphene which had been treated at 160° C. for 20 hours, a graphene which had been treated at 200° C. for 20 hours, and a graphene which had been treated at 250° C. for 20 hours were prepared.

As a result, as illustrated in FIG. 8, the graphene which had been treated at 160° C. hardly transmitted the ions due to small holes.

It is found that the graphene which has been treated at 200° C. hardly transmits Li or Na but transmits K, Rb, and Cs.

It is found that the graphene which has been treated at 250° C. transmits all the ions due to large holes.

REFERENCE SIGNS LIST 1 graphene
2 copper foil
3 film resist
4 protective layer
5 resist layer
6 support layer
7 membrane filter holder
8 syringe
9 silicon substrate

The invention claimed is:

1. A method for producing a filter molded article having a graphene layer as a filter material, the method comprising:
    forming a support layer on a surface of the graphene layer formed on an initial substrate for a graphene;
    forming water passage holes in the support layer;
    removing the initial substrate for the graphene; and
    forming water passage holes by heating and holding the graphene layer at a low temperature in the air containing oxygen of 160 to 250° C. for a predetermined time.

2. The method for producing the filter molded article according to claim 1, wherein:
    the support is a negative photoresist, and
    the step of forming water passage holes in the support layer comprises exposing portions other than portions in which water passage holes of the photoresist should be formed to light.

3. The method for producing the filter molded article according to claim 1, wherein the step of forming water passage holes by heating and holding the graphene layer at a low temperature is performed in the air containing oxygen of 200 to 250° C.

* * * * *